United States Patent [19]
Ueda

[11] Patent Number: 5,525,536
[45] Date of Patent: Jun. 11, 1996

[54] METHOD FOR PRODUCING SOI SUBSTRATE AND SEMICONDUCTOR DEVICE USING THE SAME

[75] Inventor: Sigeyuki Ueda, Kyoto, Japan

[73] Assignee: Rohm Co., Ltd., Kyoto, Japan

[21] Appl. No.: 226,841

[22] Filed: Apr. 13, 1994

Related U.S. Application Data

[62] Division of Ser. No. 994,158, Dec. 21, 1992, abandoned.

[30] Foreign Application Priority Data

Dec. 26, 1991 [JP] Japan .................................. 3-344986
Dec. 26, 1991 [JP] Japan .................................. 3-344987

[51] Int. Cl.⁶ .................................................. H01L 21/20
[52] U.S. Cl. ........................ 437/89; 437/67; 117/923; 117/935; 117/951
[58] Field of Search ...................... 437/89, 67; 117/95, 117/923, 935, 951

[56] References Cited

U.S. PATENT DOCUMENTS

| | | | |
|---|---|---|---|
| 3,791,024 | 2/1974 | Boleky, III | 257/350 |
| 4,876,581 | 10/1989 | Ishijima | 257/347 |
| 4,948,456 | 8/1990 | Schubert | 117/923 |
| 5,106,770 | 4/1992 | Bulat et al. | 437/67 |
| 5,170,231 | 12/1992 | Fujii et al. | 257/77 |
| 5,273,921 | 12/1993 | Neudeck et al. | 437/89 |
| 5,336,634 | 8/1994 | Katayama et al. | 437/67 |

FOREIGN PATENT DOCUMENTS

| | | |
|---|---|---|
| 53-38278 | 4/1978 | Japan . |
| 125920 | 4/1992 | Japan .................................. 437/89 |

OTHER PUBLICATIONS

Ohshita, Y. "Low temperature and selective growth of β–SiC using the $SiH_2Cl_2/i-C_4H_{10}/HCl/H_2$ gas system," Applied Physics Letters 57(6), 6 Aug. 1990, pp. 605–607.

*Primary Examiner*—R. Bruce Breneman
*Assistant Examiner*—Linda J. Fleck
*Attorney, Agent, or Firm*—Nikaido, Marmelstein, Murray & Oram

[57] ABSTRACT

A SOI substrate has a first insulating film formed on a semiconductor substrate. A first opening is formed thereon and a dummy layer is formed on the first opening and the first insulating film. A second opening is formed in the dummy layer and a second insulating film is formed and the dummy layer is removed by etching through the third opening to form a cavity. A semiconductor crystal layer is epitaxially grown within the cavity with use of the semiconductor substrate as a seed. The second insulating film is then removed from the semiconductor crystal layer.

1 Claim, 7 Drawing Sheets

5,525,536

1

METHOD FOR PRODUCING SOI SUBSTRATE AND SEMICONDUCTOR DEVICE USING THE SAME

This is a division of U.S. application Ser. No. 07/994,158 filed Dec. 21, 1992, now abandoned.

FIELD OF THE INVENTION

The present invention relates to a method for producing a so-called SOI substrate wherein a semiconductor crystal layer is formed on an insulating substrate. More particularly, it relates to such a method wherein an insulating film is formed on a semiconductor substrate and then a semiconductor crystal layer is epitaxially grown on the insulating film using as a seed a semiconductor crystal of the semiconductor substrate, and further it relates to a semiconductor device using the SOI substrate.

BACKGROUND OF THE INVENTION

It should be understood that the term "SOI" herein used is meant to broadly include the structure having a semiconductor crystal layer on an insulating film and is not limited to the structure having a silicon crystal layer on an insulating film. There is known a method for producing a SOI substrate, wherein an opening is formed in an insulating film on a semiconductor substrate and a semiconductor crystal layer is epitaxially grown on the insulating film using as a seed a semiconductor crystal of the exposed semiconductor substrate.

FIG. 13 shows a sectional view of a SOI substrate epitaxially grown according to the conventional method. In the method, an insulating film 22 is formed on a semiconductor substrate 21, followed by removing a portion of the insulating film 22 to form an opening 23. Then, using as a seed a semiconductor crystal exposed in the opening 23, an epitaxial layer of the same kind as or different kind from the semiconductor crystal is grown to form a semiconductor crystal layer 24 within the opening 23 first. The epitaxial growth being further continued, the semiconductor crystal layer 24 is laterally grown on the insulating film 22.

In the conventional method for obtaining a SOI substrate utilizing lateral epitaxial growth, however, the semiconductor crystal layer is epitaxially grown vertically as well as laterally on the insulating film. As a result, the semiconductor crystal layer grows thicker on the opening than on the insulating film as shown in FIG. 13, making the thickness of the crystal layer non-uniform. Accordingly, the conventional method cannot offer a semiconductor crystal layer having a uniform thickness and covering a large area.

In addition there is another problem that since each element is isolated from another by means of pn junction in a conventional semiconductor device, parasitic capacitance is generated to prevent a high-speed operation of the device or lead to latch up.

SUMMARY OF THE INVENTION

In view of the foregoing, an object of the present invention is to provide a method for producing a SOI substrate having a semiconductor crystal layer with a planarized surface or having a semiconductor crystal layer with a planarized surface which is isolated by an insulating film enclosing the same.

2

According to the present invention, there is provided a method for producing a SOI substrate, comprising the steps of: forming a first insulating film on a semiconductor substrate, followed by forming a first opening; forming a dummy layer on the first opening and the first insulating film, followed by forming a second opening; forming a second insulating film on the second opening and the dummy layer, followed by forming a third opening; removing the dummy layer by etching through the third opening to form a cavity; epitaxially growing a semiconductor crystal layer within the cavity with use of the semiconductor substrate as a seed; and removing the second insulating film on the semiconductor crystal layer.

According to the present invention, there is also provided a method for producing a SOI substrate, comprising the steps of: forming a first insulating film on a semiconductor substrate, followed by forming a first opening; forming a dummy layer on the first opening and the first insulating film, followed by forming a second opening; forming a second insulating film on the second opening and the dummy layer, followed by forming a third opening; removing the dummy layer by etching through the third opening to form a cavity; epitaxially growing a semiconductor crystal layer within the cavity with use of the semiconductor substrate as a seed; removing the semiconductor crystal layer which is present on the first opening to form a fourth opening; and forming a third insulating film in the fourth opening, followed by removing the insulating film on the semiconductor crystal layer.

In any of the above two methods the dummy layer is preferably formed of a material selected from the group consisting of an amorphous semiconductor, silicon nitride, silicon oxide and aluminum.

In any of the above two methods the semiconductor crystal layer is preferably composed of a silicon crystal layer or a silicon carbide layer.

According to the present invention, there is yet provided a SOI substrate comprising a semiconductor substrate, a plurality of concave insulating walls formed on the semiconductor substrate and each having a notch portion in the bottom thereof, and a plurality of semiconductor island regions each formed of a semiconductor crystal layer provided in a recess defined by each of the concave insulating walls.

According to the present invention, there is still yet provided a SOI substrate comprising a semiconductor substrate, a plurality of concave insulating walls formed on the semiconductor substrate, and a plurality of semiconductor island regions formed of a semiconductor crystal layer provided in a recess defined by each of the concave insulating walls.

According to the present invention, there is further provided a semiconductor device including a semiconductor circuit formed in the semiconductor island region of any of the above SOI substrates.

It is possible that the semiconductor device is made to have a three-dimensional structure wherein a plurality of semiconductor circuits are stacked up by forming at least one semiconductor island region formed with a semiconductor circuit on the passivation film formed on the surface of the above-mentioned semiconductor device.

The semiconductor device of the three-dimensional structure preferably has stacked semiconductor crystal layers including a silicon crystal layer and a silicon carbide layer.

In the present invention the cavity defined by the insulating film is formed in advance in a position intended for the semiconductor crystal layer, and then the semiconductor crystal layer is epitaxially grown within the cavity; hence, the vertical growth thereof is restricted by the upper insulating film thereby forming a planarized semiconductor layer.

Further, the dummy layer for forming the cavity can be formed by CVD or sputtering with good controllability for film thickness; hence, the semiconductor crystal layer can be formed within the cavity having a precise thickness, thus making the resulting semiconductor crystal layer very precise in thickness.

In addition, the opening formed by removing the semiconductor crystal layer which is present on the seed portion is refilled with an insulating film, whereby the semiconductor crystal layer can be completely isolated with insulator provided therearound and thereunder.

As a result, if a semiconductor device is formed using the SOI substrate thus obtained, each device is formed in each semiconductor island electrically isolated completely from other semiconductor islands, thereby preventing parasitic capacitance from generating. Accordingly, a high-speed operation can readily be attained, and the device thus formed is applicable to a high-frequency device.

DETAILED DESCRIPTION

Now, the present invention will be described in detail with reference to the drawings. FIGS. 1 to 6 are each a schematic section illustrating a step of a method for producing a SOI substrate according to a first embodiment of the present invention.

Figure 1:
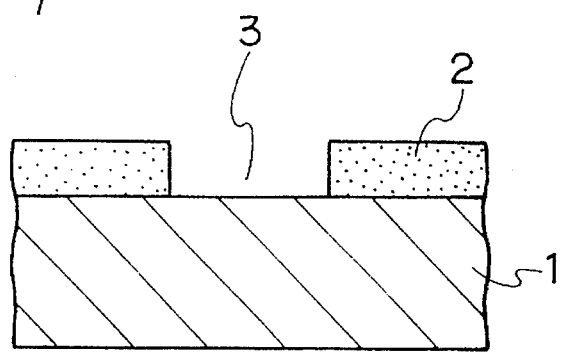
FIGS. 1 to 6 are each a schematic section illustrating a step of a method for producing a SOI substrate according to a first embodiment of the present invention.

Referring to FIG. 1, a portion of a first insulating film formed on a semiconductor substrate is removed to form a first opening 3. As the example, a silicon substrate 1 having a cube face of (100) was subjected to thermal oxidation at about 1000° C. to form a first silicon oxide film 2 to 100 nm thick as the first insulating film, followed by removing a portion of the first silicon oxide film 2 by a common photoresist process to form the first opening 3, thereby exposing a portion of the silicon substrate 1 in the opening 3.

Figure 2:
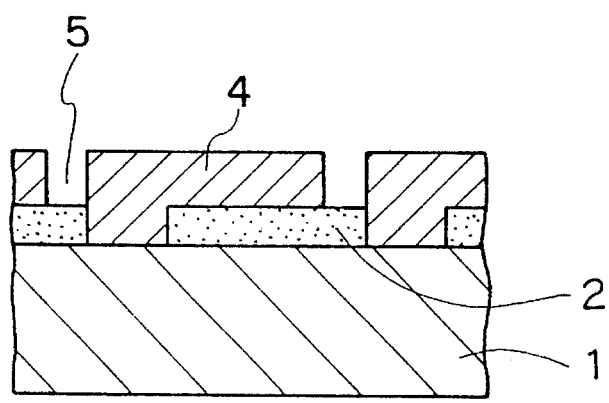

Referring next to FIG. 2, a dummy layer is formed completely on the first insulating film, followed by removing a portion of the dummy layer located so as to be adjacent a seed portion (or the first opening) of the dummy layer to form a second opening 5. As the example, a reaction furnace is charged with the substrate 1 formed with the first opening 3 in the preceeding step and the substrate 1 was subjected to plasma CVD for 60 minutes under the condition wherein the substrate temperature was set at 400° C., then silane ($SiH_4$) gas was introduced into the reaction furnace, so as to deposit an amorphous silicon layer 4 to 200 nm thick on the entire substrate surface; the surface of the amorphous silicon layer 4 was etched back to be planarized; and then, a portion of the amorphous silicon layer 4 which was located so as to be adjacent the first opening was selectively etched by a photoresist process and reactive ion etching (hereinafter referred to as "RIE") using carbon fluoride ($CF_4$) gas and chlorine ($Cl_2$) gas to form the second opening 5, thereby exposing a portion of the first silicon oxide film 2 in the second opening 5.

Figure 3:
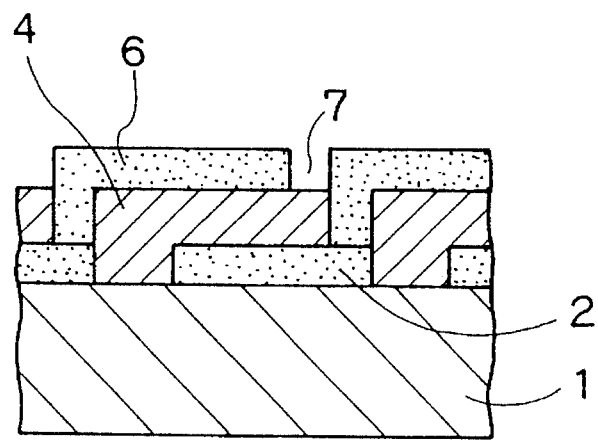

Referring next to FIG. 3, on the complete surface of the dummy layer was formed a second insulating film, followed by removing a portion of the second insulating film which is located so as to be adjacent the second opening to form a third opening 7. As the example, a second silicon oxide film 6 was deposited to 400 nm thick as the second insulating film by allowing silane ($SiH_4$) gas and dinitrogen oxide ($N_2O$) gas to react with each other in vapor phase at 800° C. At this time, the second silicon oxide film 6 was also formed in the second opening 5; accordingly, it was connected to the first silicon oxide film 2 through the second opening 5. Thereafter, a portion of the second silicon oxide film 6 which was located so as to be adjacent the second opening 5 and on one end portion of the amorphous silicon layer 4 was removed by etching to form a third opening 7, thereby exposing a portion of the amorphous silicon layer 4 in the third opening 7. The third opening 7 thus formed was spaced 2 μm apart from the first opening 3, or the seed portion.

Figure 4:
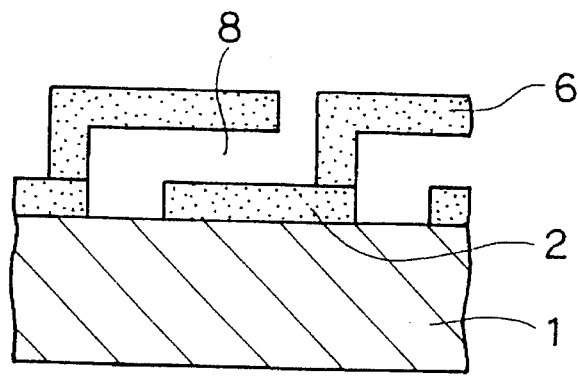

Referring next to FIG. 4, the dummy layer 4 is removed by etching through the third opening 7 to form a cavity 8 within which a semiconductor crystal layer to be described later will be epitaxially grown. As the example, introduction of hydrogen chloride gas in the reaction furnace at an ambient temperature caused only the amorphous silicon layer 4 to be etched away gradually from the third opening 7 to form the cavity 8. A bottom portion of the cavity 8 adjacent the semiconductor substrate 1 correspond to the first opening 3. Then, the semiconductor silicon substrate 1 was exposed in that portion.

Figure 5:
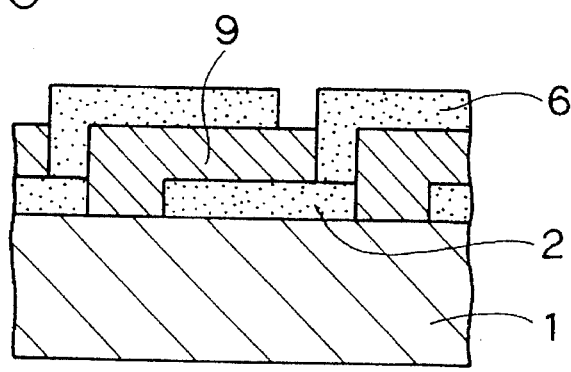

Referring to FIG. 5, a semiconductor crystal layer is epitaxially grown within the cavity 8 with use of the exposed portion of the semiconductor substrate 1 as a seed. As the example, a mixed gas of disilane ($Si_2H_6$) at 0.15 sccm and acetylene ($C_2H_2$) at 0.15 sccm as gases used for epitaxial growth, hydrogen ($H_2$) gas at 3 slm as a carrier gas and hydrogen chloride (HCl) at 10 sccm as an etchant agent was allowed to react for 10 minutes above the substrate surface with the substrate temperature set at 1350° C. In this case, the gases used for epitaxial growth were introduced into the cavity 8 through the third opening 7. Then, epitaxial growth took place with utilizing the exposed portion of the semiconductor substrate 1 as a seed, thereby forming a silicon carbide (SIC) crystal layer 9. In this epitaxial growth the second silicon oxide film 6 defining the upper portion of the cavity 8 restricted the vertical growth, so that the upper face of the silicon carbide layer 9 was planarized. Here, adjusting the flow rates of the gases used for the growth would make it possible to cause the growth from only the silicon substrate 1 without growth on the surface of the second silicon oxide film 6. This is because although deposition of silicon carbide takes place even on the second silicon oxide film 6, the deposited silicon carbide thereon is etched away by the hydrogen chloride gas contained in the mixed gas because of poor adherence thereof to silicon oxide. On the other hand, deposition of silicon carbide on the seed portion of the silicon substrate will not be etched away because of good adherence thereof to the silicon substrate 1. Accordingly, it is necessary to determine the flow rate of hydrogen chloride gas so as to serve this purpose.

Figure 6:
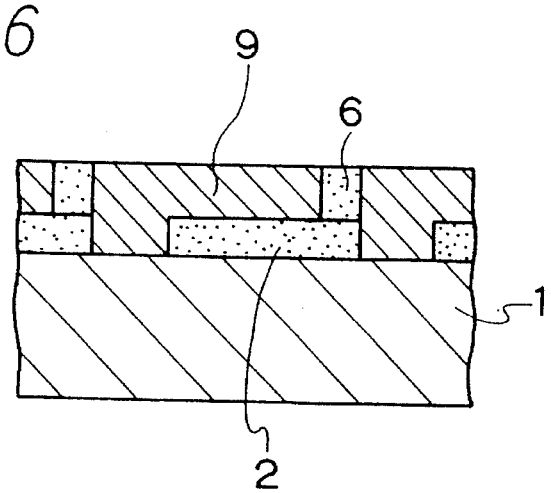

Referring finally to FIG. 6, the second insulating film is removed to expose the semiconductor crystal layer. As the example, the second silicon oxide film 6 was removed by etching with using hydrofluoric acide.

Thus, a SOI substrate according to a first embodiment was completed as having a planarized semiconductor crystal layer on an insulating film. It should be noted that the thickness of the amorphous semiconductor layer determines the thickness of the semiconductor crystal layer, and that the thickness of the amorphous semiconductor layer can be controlled relatively easily. Then, the thickness of the semiconductor crystal layer can also be controlled relatively easily.

Next, a method for producing a SOI substrate according to a second embodiment of the present invention will be described with reference to FIGS. 8 to 11. In this embodiment a semiconductor crystal layer is completely isolated with an insulator enclosing and underlying the semiconductor crystal layer.

Firstly, in the same manner as in the first embodiment a SOI substrate as shown in FIG. 6 is formed, wherein a semiconductor crystal layer is formed on a semiconductor substrate with sandwiching an insulating film partially removed.

Figure 8:
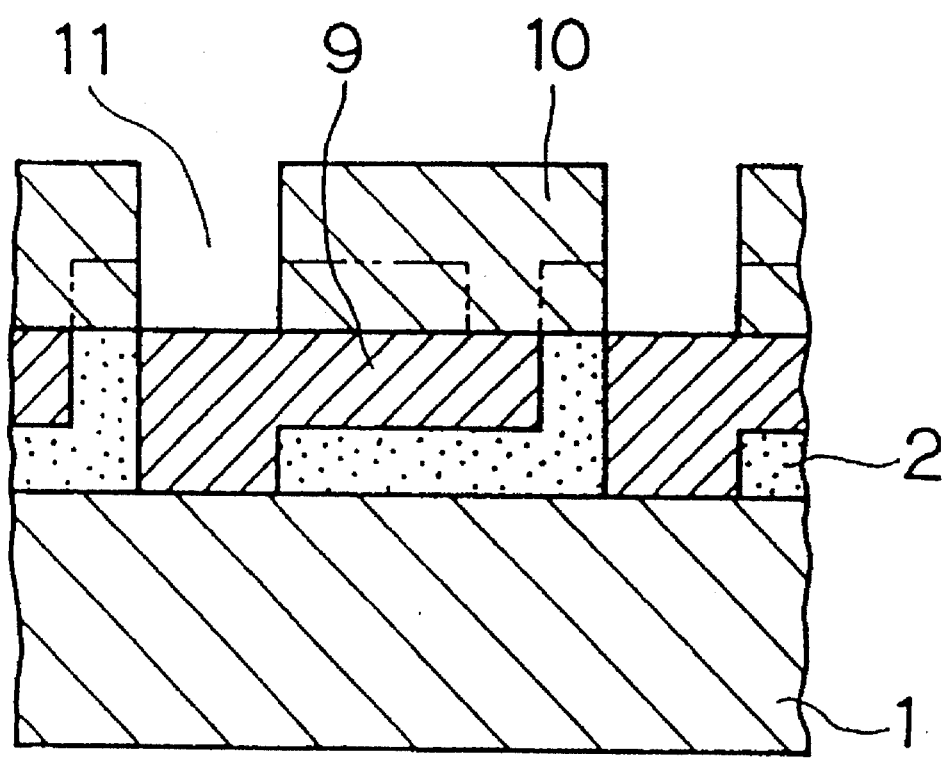
FIGS. 8 to 11 are each a schematic section illustrating a step of a method for producing a SOI substrate according to a second embodiment of the present invention.
Figure 9:
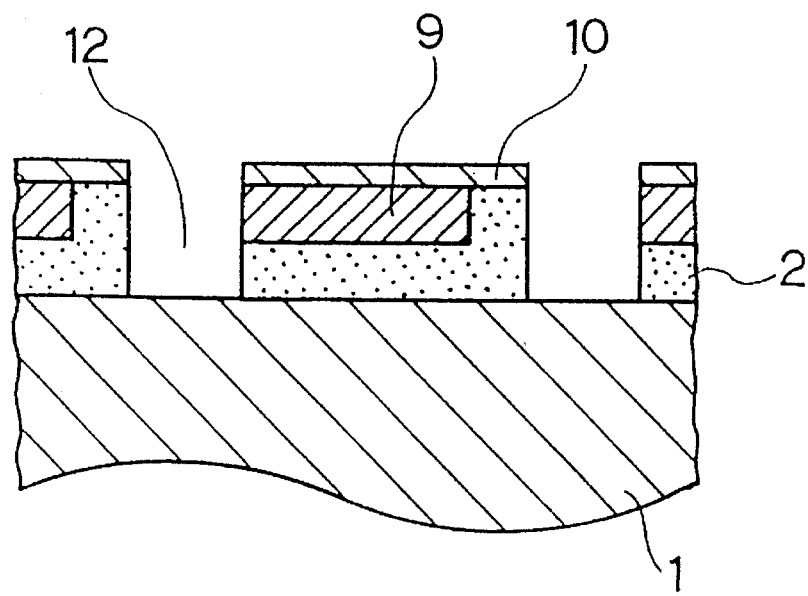

Next, referring to FIGS. 8 and 9, a portion of the semiconductor crystal layer which is located on the first opening is removed to form a fourth opening 12. As the example, a silicon oxide film 10 was deposited to 1 μm thick on the substrate surface by a CVD method wherein silane (SiH$_4$) gas and dinitrogen oxide (N$_2$O) gas were allowed to react with each other in vapor phase at 750° to 850° C., and then a portion of the silicon oxide film 10 which was located above the seed portion (first opening 3) was etched away by a photoresist process to expose a portion of the silicon carbide crystal layer 9 which was located on the seed portion (first opening 3), as shown in FIG. 8.

In turn, as shown in FIG. 9, the fourth opening 12 was formed by subjecting the entire substrate surface to RIE with using carbon fluoride (CF$_4$) and oxygen (O$_2$) as etching agent. As a result, a portion of the silicon carbide crystal layer 9 which was located on the seed portion was removed, the semiconductor substrate 1 was exposed, and the silicon carbide crystal layer 9 was completely isolated from the semiconductor substrate 1. In this case, although the silicon oxide film 10 was also etched, it was retained slightly so as not to damage the semiconductor crystal layer 9, by making the silicon oxide film 10 relatively thick previously.

Figure 10:
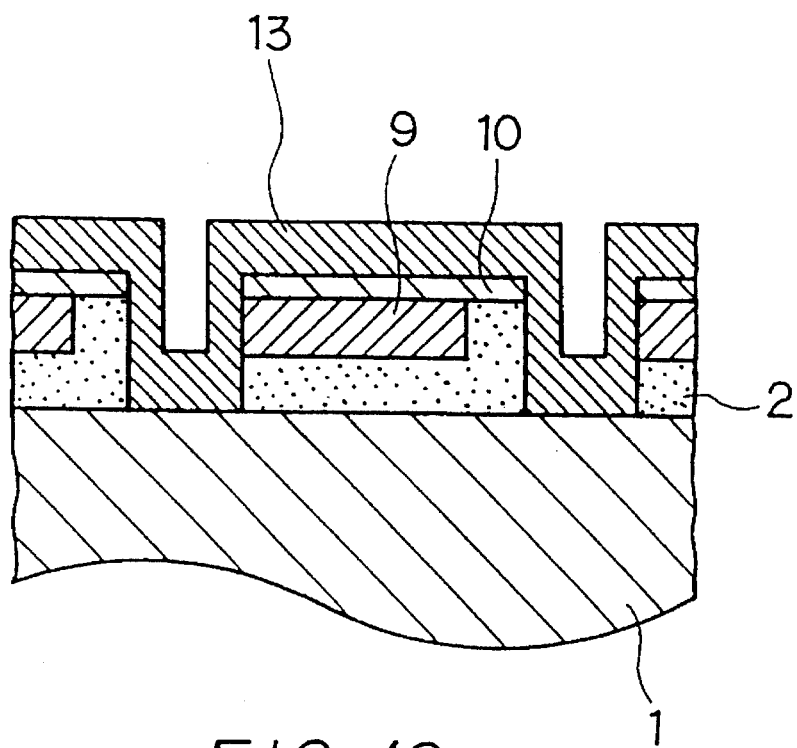
Figure 11:
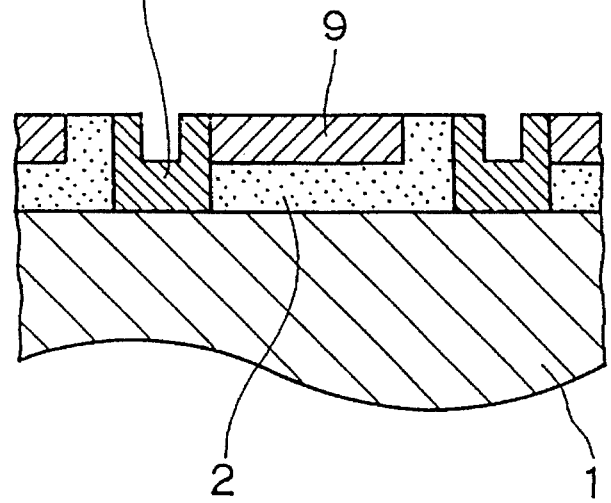
Figure 13:
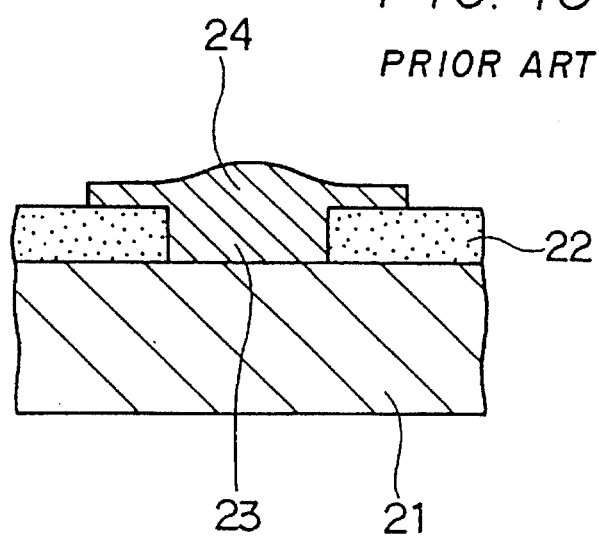
FIG. 13 is a schematic section showing a SOI substrate produced in accordance with a conventional epitaxial growth.

Referring next to FIGS. 10 and 11, an inner surface of the fourth opening 12 was completely covered with a third insulating film, followed by removing the insulating film remaining on the semiconductor crystal layer 9 to form a SOI substrate. As the example, a third silicon oxide film 13 was deposited to 100 nm thick to cover the substrate surface by a CVD method wherein silane (SiH$_4$) gas and dinitrogen oxide (N$_2$O) gas were allowed to react with each other with the substrate temperature set at 750° to 800° C. Thereafter, the silicon oxide films 10 and 13 on the semiconductor crystal layer 9 were removed to expose the semiconductor crystal layer 9 by wet etching with a mask provided above the seed portion. In this case, the silicon oxide film 13 around the silicon carbide crystal layer 9 was made to remain thereby isolating the crystal layer 9 laterally and vertically.

Thus, a SOI substrate as shown in FIG. 1 was obtained, wherein a planarized semiconductor crystal layer was formed on the insulating film and isolated with insulator like an island. As in the first embodiment, it should be noted that the thickness of the amorphous semiconductor layer determines the thickness of the semiconductor crystal layer, and that the thickness of the amorphous semiconductor layer can be controlled relatively easily. Then, the thickness of the semiconductor crystal layer can also be controlled relatively easily.

In the above embodiments, amorphous silicon is deposited as a dummy layer which is in turn removed by etching after an insulating film is formed. However, in the present invention, a material which is used for the dummy layer is not limited to amorphous silicon. Any material, which can be easily deposited and etch solely the dummy layer without etching the insulating film and semiconductor substrate, can be used for the dummy layer. For instance, if silicon dioxide is used for the material of an insulating film, amorphous semiconductor such as amorphous silicon carbide, silicon nitride, and aluminum can be used instead of amorphous silicon. In the case of aluminum, there are problems to be overcome such that the resulting aluminum film tends to have ridge or unevenness, the insulating film to be formed thereon must be formed at a low temperature, care should be taken so as not to damage the seed portion, and the like. If such problems can be overcome, the aluminum film can be used for the dummy layer.

When using silicon nitride for the dummy layer, silane (SiH$_4$) gas and ammonia (NH$_3$) gas are allowed to react with each other in vapor phase at 350° C. to form a planarized silicon nitride layer, which can be etched by heated phosphoric acid without etching other layers such as an insulating film.

Alternatively, if a silicon nitride film is used for the insulating film, a silicon oxide film can be used for the dummy layer.

Further, although in the above embodiment silicon carbide is used for the semiconductor crystal layer, another semiconductor crystal made of silicon can be used therefor.

With regard to the SOI substrate according to the first embodiment, although the semiconductor crystal layer is partially connected to the semiconductor substrate, it is isolated with insulating films to form a semiconductor island region. Therefore, the semiconductor device, wherein each of the elements is insulated each other by the insulating film and further the semiconductor device is provided with an integrated circuit, can be obtained by a normal process. In this case, each of the semiconductor regions on the SOI substrate is not a completely-independent island region. However, each of the semiconductor region can be electrically isolated if conductive-type of the semiconductor substrate is different from that of the substrate. In addition, parasitic capacitance can be suppressed to the minimum because the area connecting to the substrate is rather small. Thus, the semiconductor device is obtained with isolation sufficiently achieved and hence is highly adaptable for a high-speed operation.

With regard to the SOI substrate according to the second embodiment, since semiconductor crystal layers on the substrate are completely isolated with insulator, a semiconductor device with isolation which is free from the generation of parasitic capacitance can be completely achieved by virtue of formation of a semiconductor circuit in each of the semiconductor crystal layers, and hence, free from latch up.

Figure 7:
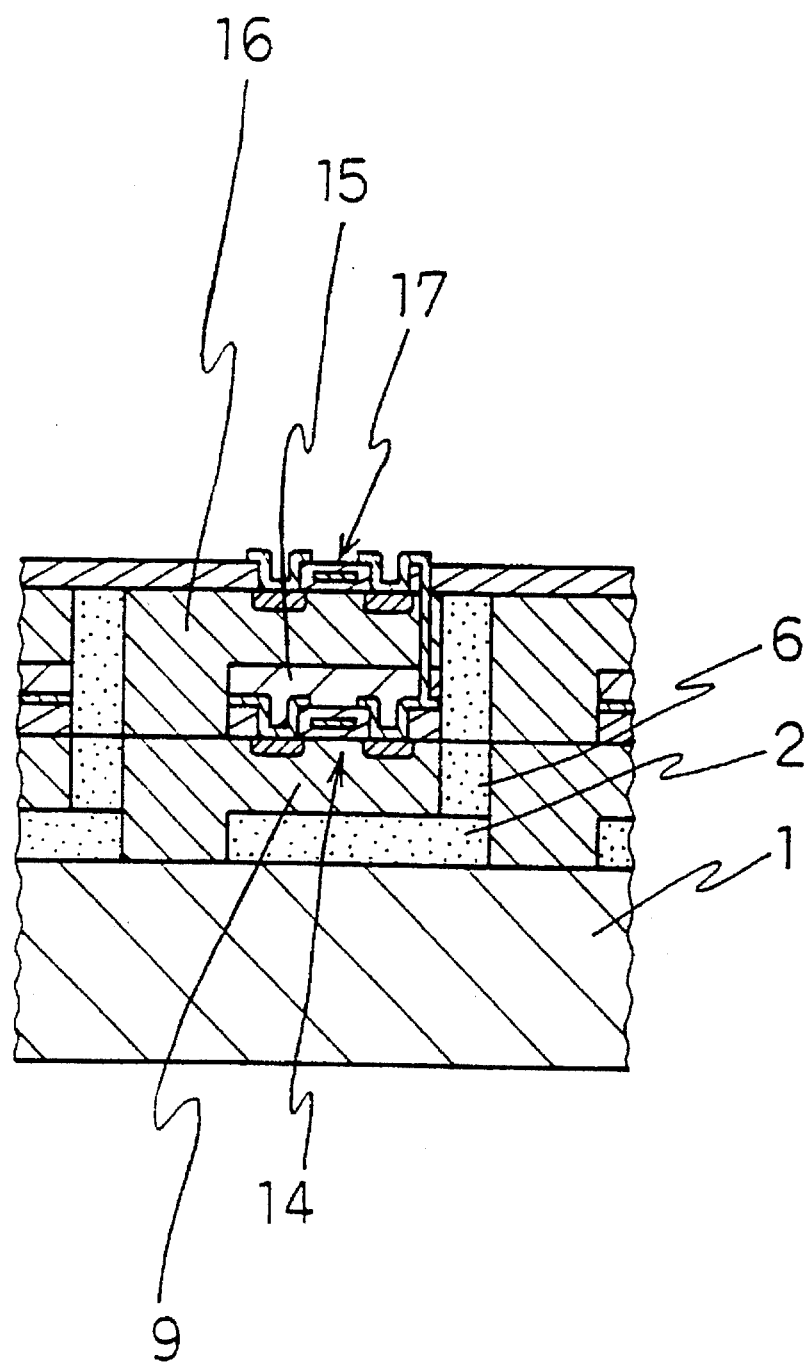
FIG. 7 is a sectional view illustrating a semiconductor device of three-dimensional structure wherein two stacked-up semiconductor circuits are formed on the SOI substrate according to the first embodiment of the present invention.
Figure 12:
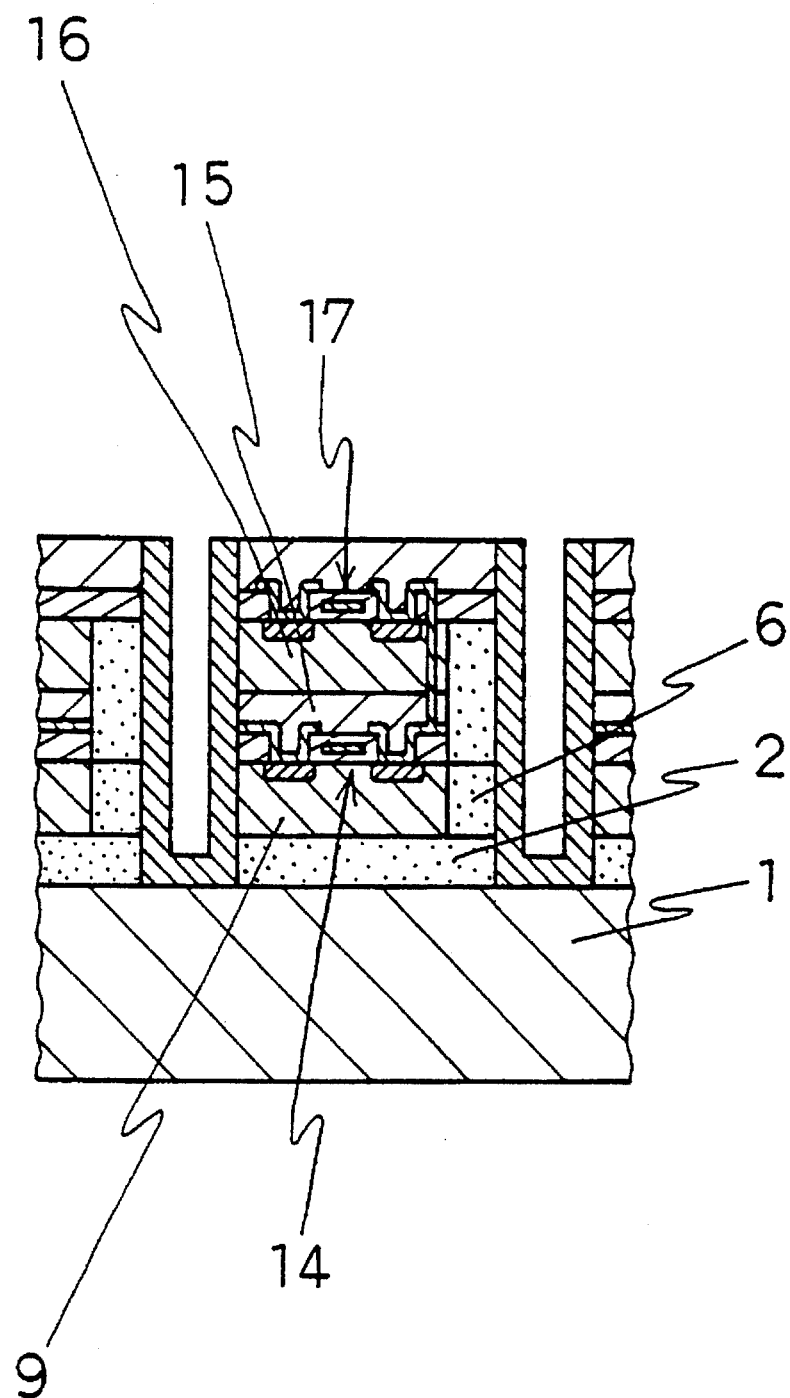
FIG. 12 is a sectional view illustrating a semiconductor device of three-dimensional structure wherein two stacked-up semiconductor circuits are formed on the SOI substrate according to the second embodiment of the present invention.

Further, as shown in FIGS. 7 and 12, if a passivation film 15 on the surface of a semiconductor device having a semiconductor circuit 14 in a semiconductor crystal layer 9 is planarized and a second semiconductor crystal layer 16 is grown thereon, in the same manner as described above a second semiconductor circuit 17 can be formed in the second semiconductor crystal layer 16 which lies above the semiconductor circuit 14. Repeating this process makes it possible to form a plurality of stacked-up circuits and hence can form a three-dimensional semiconductor device, leading to a higher device integration. In this case, the stacked-up semiconductor crystal layers can be made to include a silicon crystal layer and a silicon carbide layer, thereby forming a three-dimensional semiconductor device of a composite type, which utilizes the characteristics inherent to each type of the semiconductor crystal layers.

According to the present invention, as has been described, a cavity is defined by an insulating film on a substrate and a second insulating film above the substrate, and a semiconductor crystal layer is epitaxially grown within the cavity. Then, the vertical epitaxial growth is restricted by the top wall defining the cavity, or the second insulating film thereby to promote the lateral epitaxial growth. Accordingly, the semiconductor crystal layer with the top surface planarized can be obtained on the insulating film, thus assuring a precisely-formed circuit.

Further, according to the present invention, the shape of the cavity is defined by previously forming a dummy layer such as of amorphous semiconductor or silicon nitride having a relatively good controllability for film thickness; hence, a semiconductor crystal layer with a precise thickness can be obtained on an insulating film.

In addition, by removing a portion of the semiconductor crystal layer which is located on a seed portion to form an opening and refilling the opening with an insulating film, region forming a device region composed of the semiconductor crystal layer can be electrically isolated completely from other regions for forming the device and the substrate, whereby occurrence of parasitic capacitance and latch up can be prevented, and operation speed of a device as well as performance for a high-frequency device can be improved.

As a result, the present invention offers an effect such as to give an improved semiconductor device having a good insulating property and being isolated with an insulating film, by forming a semiconductor circuit in a semiconductor crystal layer, using the SOI substrate of the invention.

Though several embodiments of the present invention are described above, it is to be understood that the present invention is not limited only to the above-mentioned, various changes and modifications may be made in the invention without departing from the spirit and scope thereof.

What is claimed is:

1. A method for producing a semiconductor device, comprising the steps of:

(a) forming a first insulating film on a semiconductor substrate, followed by forming first openings in the first insulating film;

(b) forming a dummy layer in said first openings and on said first insulating film;

(c) forming a plurality of island regions by forming second openings in the dummy layer and forming a second insulating film in said second openings of the dummy layer and on said dummy layer;

(d) forming third openings in the second insulating film;

(e) removing said dummy layer by etching through said third openings to form cavities;

(f) epitaxially growing a semiconductor crystal layer within said cavities with use of said semiconductor substrate as a seed;

(g) removing said semiconductor crystal layer in said first openings, followed by forming fourth openings;

(h) forming a third insulating film in said fourth openings, followed by removing said insulating film on said semiconductor crystal layer;

(i) forming a semiconductor element in said semiconductor crystal layer;

(j) forming an insulating film on said semiconductor crystal layer; and (k) repeating the steps (a) to (i) at least once.

* * * * *